United States Patent [19]

Noguchi et al.

[11] Patent Number: 5,373,803
[45] Date of Patent: Dec. 20, 1994

[54] METHOD OF EPITAXIAL GROWTH OF SEMICONDUCTOR

[75] Inventors: Takashi Noguchi; Toshiharu Suzuki, both of Kanagawa, Japan

[73] Assignee: Sony Corporation, Tokyo, Japan

[21] Appl. No.: 954,341

[22] Filed: Sep. 30, 1992

[30] Foreign Application Priority Data

Oct. 4, 1991 [JP] Japan .................. 3-285702
Feb. 10, 1992 [JP] Japan .................. 4-056596

[51] Int. Cl.⁵ .................................. C30B 1/06
[52] U.S. Cl. .................................. 117/8; 117/9; 117/10; 117/913; 117/930; 437/82; 437/108
[58] Field of Search ....... 156/603, DIG. 61, DIG. 73; 437/82, 108, 973; 117/8, 9, 10, 930, 913

[56] References Cited

U.S. PATENT DOCUMENTS

| | | | |
|---|---|---|---|
| 3,585,088 | 6/1971 | Schwuttke et al. | 156/603 |
| 4,046,618 | 9/1977 | Chaudhari et al. | 156/603 |
| 4,383,883 | 5/1983 | Mizutani | 156/603 |
| 4,500,388 | 2/1985 | Ohmura et al. | 156/603 |
| 4,576,851 | 3/1986 | Iwamatsu | 156/603 |
| 4,661,167 | 4/1987 | Kusunoki et al. | 437/173 |
| 4,751,193 | 6/1988 | Myrick | 156/603 |

*Primary Examiner*—Robert M. Kunemund
*Attorney, Agent, or Firm*—Hill, Steadman & Simpson

[57] ABSTRACT

A method of epitaxially growing semiconductor crystal by which a single crystal region which is superior in quality can be selectively formed at a high throughput without employing the lithography technique. A shield mask is formed on an upper face of an amorphous semiconductor layer formed on substrate, and excimer laser light is irradiated upon the amorphous semiconductor layer using the shield mask to produce, in the amorphous semiconductor layer, a core from which crystal is to be grown. After the shield mask is removed, low temperature solid phase annealing processing for the amorphous semiconductor layer is performed to grow crystal from the core to form a single crystal region in the amorphous semiconductor layer. Alternatively, the silicon core is formed by irradiating an energy beam, which is capable of being converged into a thin beam and being used to directly draw a picture, at a predetermined position of the amorphous silicon film.

3 Claims, 5 Drawing Sheets

F I G. 2(1)
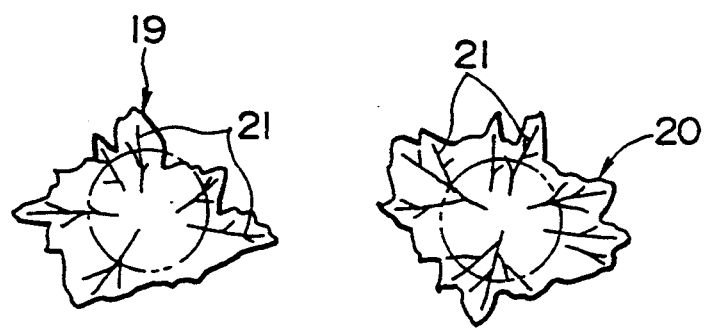
F I G. 2(2)
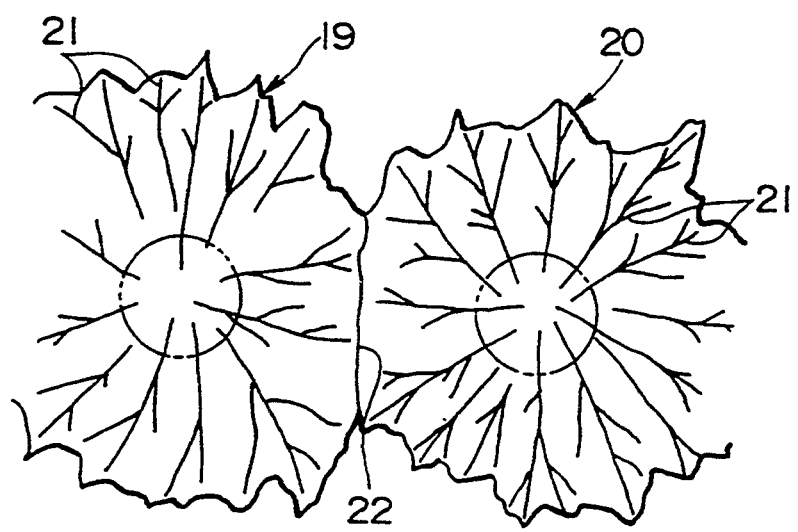

METHOD OF EPITAXIAL GROWTH OF SEMICONDUCTOR

BACKGROUND OF THE INVENTION

1. Field of the Invention

This invention relates to a method of growing semiconductor crystal for the crystallization of an amorphous silicon layer such as a SOI substrate or a SOS substrate.

2. Description of the Related Art

Load type memory cells formed from polycrystalline silicon are used for a static RAM (random access memory) (hereinafter referred to as SRAM) of the high resistance load type. However, a SRAM of the high resistance load type is difficult to sufficiently assure an operation margin, reliability, a stand-by current and so forth. In order to solve these problems, a SRAM of the layered type has been proposed wherein thin film transistors formed from thin films of amorphous silicon or polycrystalline silicon are employed as load elements. Thin film transistors are employed also for liquid crystal display panels. Polycrystalline silicon thin films are commonly employed for thin film transistors for which high performances for an on-current characteristic, a sub-threshold characteristic, an on/off current ratio and so forth are required. Thus, efforts have been and are being made to achieve enhancement of the characteristics by increasing the size of polycrystalline silicon grains and decreasing the trap density in a Polycrystalline silicon thin film.

Various methods of forming polycrystalline silicon have been proposed including an ordinary chemical vapor phase growing method and a random solid phase growing method. Particularly the random solid phase growing method allows formation of a polycrystalline silicon layer wherein the crystalline grains have a large diameter of 1 μm or more.

Also a method of forming thin film transistors in a selectively formed single crystal region has been proposed.

In order to improve the problems described above where a polycrystalline silicon film is employed, a further method has been proposed in recent years wherein the dose of implantation of $Si^+$ for the conversion into the amorphous phase is reduced at a predetermined position, at which a core for the crystallization is to be formed. The method is disclosed in H. Kumomi et al., "Control of Grain-Location in Solid State Crystallization of Si", *Extended Abstracts of the 22nd (1990 International) Conference on Solid State Devices and Materials*, Sendai, 1990, pp. 1159–1160 and also in Japanese Patent Laid-Open Application No. 3-125422.

The method disclosed in Japanese Patent Laid-Open Application No. 3-125422 is described subsequently with reference to FIGS. 3(1) to 3(3). In particular, ions of silicon ($Si^+$) are first implanted at a low dose into a polycrystalline silicon layer 52 on a $SiO_2$ layer 51 as shown in FIG. 3(1). Then, a resist mask 53 is formed on an upper face of the polycrystalline silicon layer 52 as shown in FIG. 3(2) using the lithography technique, and ions of $Si^+$ are selectively implanted at a high dose into portions of the polycrystalline silicon layer 52 at which it is not covered with the resist mask 53. Subsequently, the resist mask 53 is removed, and crystals of silicon are grown at a high dosage by the low temperature solid phase growing method at locations around the regions in which ions have not been implanted, thereby forming single crystal silicon regions 54.

With the method of forming a polycrystalline silicon film by the ordinary chemical vapor phase growing method, however, if it is intended to form crystal grains of a large size, then it is difficult to form a polycrystalline silicon film which is superior in uniformity of the film quality and has a high mobility with low leakage.

Meanwhile, with the random solid phase growing method, since it is difficult to selectively grow crystal, it sometimes occurs that a channel of a transistor extends to a grain boundary. If this actually occurs, then a dispersion occurs the leakage current or threshold voltage, which deteriorates the reliability of the transistor.

On the other hand, with the method of selectively forming a single crystal silicon region, also the problem of pollution of resist is involved and a low dose region is non-uniform. Further, that the resist is left locally is unstable and has with holes.

Further, also a method of irradiating an argon ion laser beam to achieve crystallization, a SIMOX method, a zone melt method and so forth have been proposed as methods of forming a SOI substrate. However, any of the methods is low in repeatability and also in throughput.

Meanwhile, with a method wherein a laser beam is selectively irradiated is disclosed in Japanese Patent Laid-Open Application No. 3-285720, it is difficult to assure the uniformity of an excimer laser beam.

SUMMARY OF THE INVENTION

It is an object of the present invention to provide a method of epitaxially growing semiconductor crystals by which a single crystal region which is superior in quality can be selectively formed.

It is another object of the present invention to provide a method of epitaxially growing semiconductor crystal by which a large single crystal region which is superior in quality can be selectively formed at a high throughput without employing the lithography technique.

In order to attain the objects, according to an aspect of the present invention, there is provided a method of epitaxially growing semiconductor crystal, which comprises the steps of forming an amorphous semiconductor layer on a substrate, forming a shield mask, in which a through-hole is formed, on an upper face of the amorphous semiconductor layer on the substrate, irradiating with excimer laser light upon the amorphous semiconductor layer using the shield mask to produce at a portion in the amorphous semiconductor layer corresponding to the through-hole, a core from which crystal is to be grown. Removing the shield mask, and growing, by low temperature solid phase annealing processing for the amorphous semiconductor layer, crystal from the core to form a single crystal region in the amorphous semiconductor layer.

In the method of epitaxially growing semiconductor crystals, a shield mask is formed on an upper face of an amorphous semiconductor layer formed on a substrate, and using the shield mask, excimer laser light is irradiated at a portion of the amorphous semiconductor layer at which a single crystal region is to be formed. Consequently, a core from which crystal is to be grown is produced. Then, a low temperature solid phase growth is performed to grow crystals from the core to form a single crystal region.

With the method of epitaxially growing semiconductor crystal, since a core is produced in an amorphous semiconductor layer by irradiation of excimer laser light, the time required for production of a core can be decreased and the throughput in crystallization is improved. Further, since excimer laser light is irradiated, using a shield mask, only at a portion of an amorphous semiconductor layer which is to be crystallized, a single crystal region can be selectively formed, and consequently, a single crystal region can be formed in a region in which a channel layer of a transistor is to be formed. As a result, no grain boundary exists in the channel layer, and consequently, the leakage current is reduced substantially, and the mobility is increased and the dispersion in threshold voltage is reduced. Consequently, a transistor thus produced has high reliability.

The shield mask forming step may include the steps of forming a silicon oxide film on the upper face of the amorphous semiconductor layer, forming a silicon film on an upper face of the silicon oxide film, and forming a through-hole in the silicon oxide film and the silicon film which serve as the shield mask. Preferably, the thickness of the silicon film is equal to or greater than 80 nm.

According to another aspect of the present invention, there is provided a method of epitaxially growing semiconductor crystals, which comprises the steps of forming an amorphous silicon thin film, irradiating with an energy beam, which is capable of being converged into a thin beam and being used to directly draw a picture, at a predetermined position of the amorphous silicon film to form a fine silicon core for the crystallization in the amorphous silicon thin film, and solid phase growing crystals at a low temperature from the silicon core to form a polycrystalline silicon grain of a large diameter in the amorphous silicon thin film.

An energy beam is used which can be converged into a thin beam without having a bad influence on a thin film transistor which is to be formed and can be controlled so as to irradiate at an arbitrary position accurately and which also can be used to directly draw a picture. The energy beam may be a focused ion beam, for which, for example, He+ ions may be used as an ion seed, or an electron beam, which can be converged to a smaller diameter than a focused ion beam. Preferably, the energy beam is converges so that it has a diameter equal to or less than 2 $\mu$m.

A silicon core which is formed by irradiation of an energy beam may be in a crystallized condition or an amorphous condition.

An amorphous silicon thin film can be formed by an ordinary chemical vapor deposition method or by ion implantation of silicon into a polycrystalline silicon thin film. Preferably, the low temperature at which crystal is to be solid phase grown is 600° C. or so. The size of polycrystalline silicon grains should be, for the application in, for example, a 16 megabit SRAM or a 64 megabit SRAM, greater than 2 $\mu$m or so because the gate length and gate width of a thin film transistor is less than 1 $\mu$m.

With the method of epitaxially growing semiconductor crystal, since an energy beam which can be used to draw a picture directly is employed, the lithography technique need not be used. Besides, since an energy beam which can be converged to a thin beam is irradiated at a predetermined position of an amorphous silicon thin film to form a fine silicon core in the amorphous silicon thin film, the size of the silicon core can be made small as compared with the prior art. As a result, the probability that a single crystal grain can be formed is substantially increased as compared with the prior art.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 2(1) and 2(2) are schematic views illustrating growth of crystal in low temperature solid phase annealing processing;

DETAILED DESCRIPTION OF THE PREFERRED EMBODIMENTS

Figure 1:
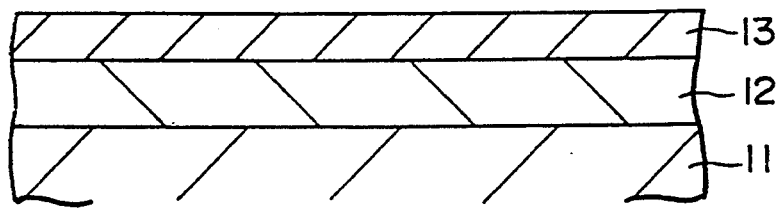
FIGS. 1(1) to 1(4) are schematic sectional views showing different steps of forming a single crystal region in a method of epitaxially growing semiconductor crystal of a preferred embodiment of the present invention.
Figure 1:
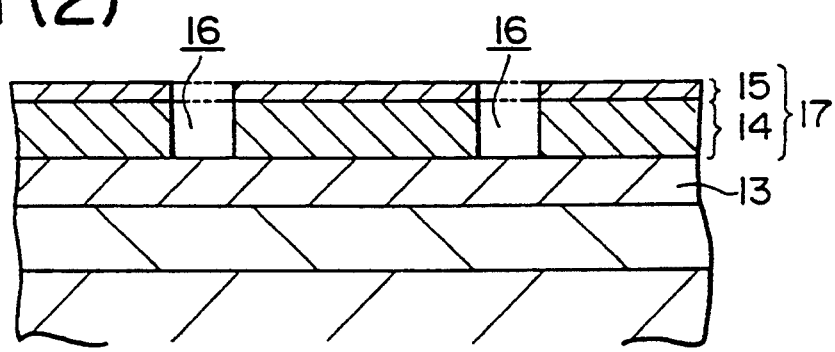
Figure 1:
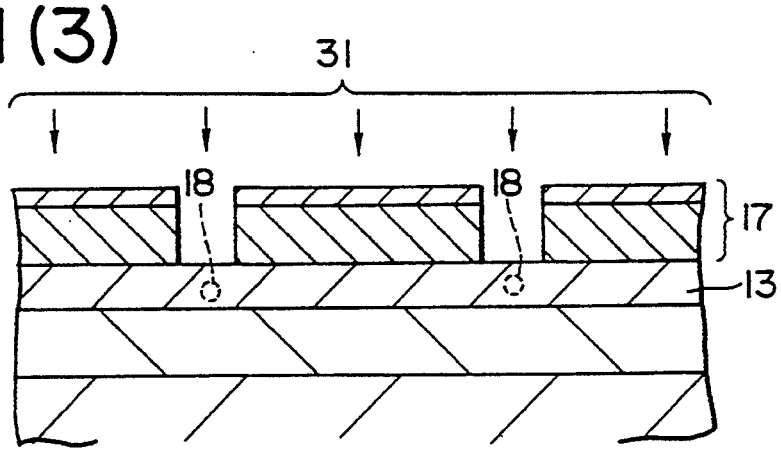
Figure 1:
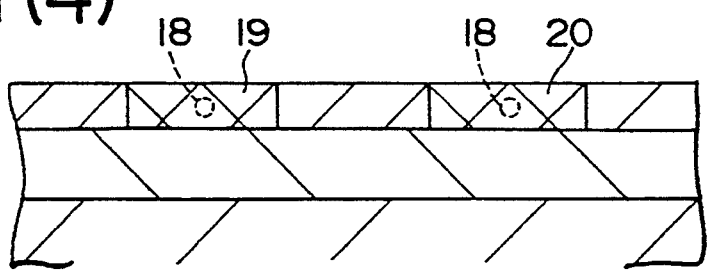
Figure 3:
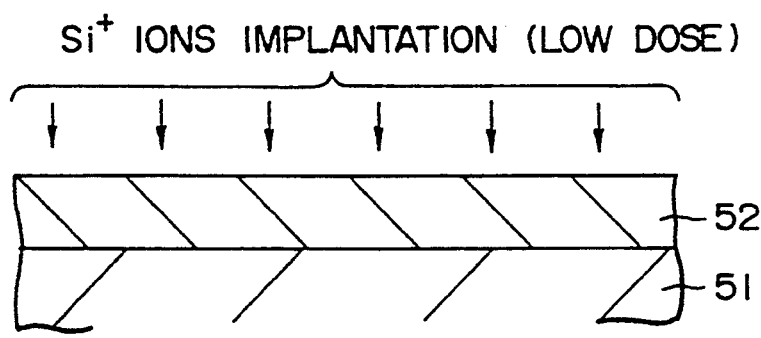
FIGS. 3(1) to 3(3) are schematic sectional views showing different steps of a conventional crystal growing method.
Figure 3:
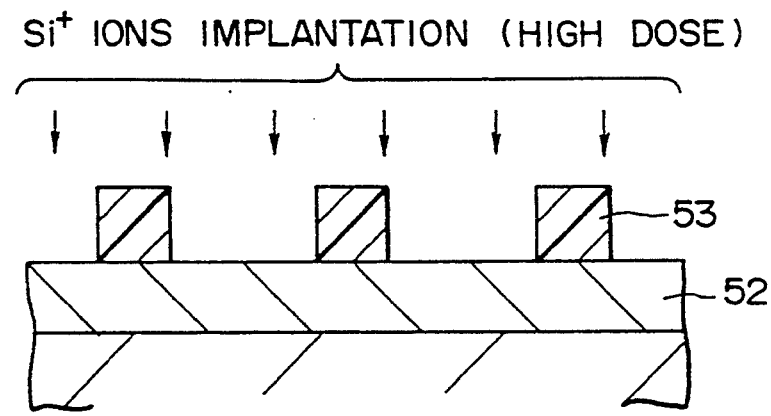
Figure 3:
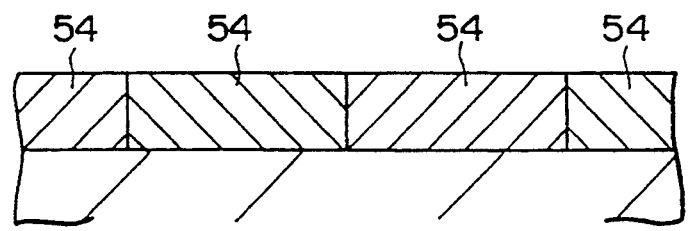

Different steps of a process of forming a single crystal region in a method of epitaxially growing semiconductor crystal of a preferred embodiment of the present invention are illustrated in FIGS. 1(1) to 1(3).

Referring first to FIG. 1(1), an insulating film 12 of silicon oxide (SiO$_2$) is formed on an upper face of a substrate 11 made of silicon by, for example, a low pressure chemical vapor phase growing method. Then, an amorphous semiconductor layer 13 of amorphous silicon is formed with the thickness of, for example, 40 nm on an upper face of the insulating film 12 by a low pressure chemical vapor phase growing method using mono-silane (SiH$_4$) of disilane (Si$_2$H$_6$) as reaction gas or by another chemical vapor phase growing method which employs plasma or by a like method. The film forming temperature then is set to a value equal to or lower than 50° C. in order to obtain a film of the amorphous phase if ion implantation of Si+ is not performed after formation of the film.

The step described above may be replaced by another step at which a polycrystalline silicon layer is formed on the upper face of the substrate 11 by the chemical vapor phase growing method, and then, ions of silicon (Si+) are implanted into the polycrystalline silicon layer thus formed, whereafter the polycrystalline silicon layer is converted into the amorphous phase to form the amorphous semiconductor layer 13.

Or else, it is also possible to form, without forming the insulating film 12 of silicon oxide on the upper face of the substrate 11, the substrate 11 from quartz glass and the forming the amorphous semiconductor layer 13 made of amorphous silicon on the substrate 11 by a chemical vapor phase growing method in a similar manner as described above.

Subsequently, a silicon oxide film 14 of the thickness of about 500 nm and a silicon film 15 of the thickness of about 100 nm are formed in a layered condition on an upper face of the amorphous semiconductor layer 13 as seen in FIG. 1(2) by, for example, a chemical vapor phase growing method.

It is to be noted that the silicon oxide film 14 is formed with a thickness which is sufficient to allow, when an excimer laser beam is irradiated upon the silicon oxide film 14, that heat produced from the excimer laser beam by the silicon film 15 to radiate sufficiently from the silicon oxide film 14.

Meanwhile, the thickness of the silicon film 15 is not limited to 100 nm so long as if it does not pass an excimer laser beam therethrough. Since a laser beam cannot pass through a silicon film normally if the silicon film has the thickness of 80 nm, the silicon film is formed with the thickness equal to or greater than 80 nm.

Then, an etching mask of resist not shown is formed on an Upper face of the silicon film 15 by ordinary photolithography. Subsequently, using the etching mask, the silicon film 15 and the silicon oxide film 14 are anisotropically etched to remove portions of the films 15 and 16 indicated by alternate long and two short dashes lines in FIG. 1(2) by, for example, reactive ion etching. Consequently, a shield mask 17 including the silicon film 15 and the silicon oxide film 14 in which through-holes 16 are formed is formed.

Each of the through-holes 16 is formed at the center of a region in which crystal is to be grown, and has a diameter smaller than 0.8 $\mu$m. When the through-holes 16 are formed with the diameter equal to or greater than 0.8 $\mu$m, polycrystalline silicon will be grown at the locations of the through-holes 16 by low temperature solid phase growing processing, which will be hereinafter described.

Subsequently, the etching mask is removed, for example, by ushering processing as seen from FIG. 1(3).

Then, excimer laser light 31 is irradiated toward the amorphous semiconductor layer 13 by way of the shield mask 17. The excimer laser light 31 passes through the through-holes 16 and irradiates the amorphous semiconductor layer 13, whereupon cores 18 are produced at the thus irradiated portions in the amorphous semiconductor layer 13. The energy density of the excimer laser light 31 to be irradiated is set to a level at which the amorphous semiconductor layer 13 is not crystallized in accordance with the thickness of the amorphous semiconductor layer 13, and for example, when the thickness of the amorphous semiconductor layer 13 is 40 nm, to for example, at 160 mJ/cm$^2$.

Subsequently, the shield mask 17 shown in FIG. 1(3) is removed as seen in FIG. 1(4) by suitable means which does not damage the amorphous semiconductor layer 13 such by wet etching or plasma etching.

Then, the amorphous semiconductor layer 13 in which the cores 18 have been produced is processed by low temperature solid phase annealing to grow dendrite from the cores 18 until single crystal regions 19 and 20 of dendrite having a width and a length of about several $\mu$m are produced.

The low temperature solid phase annealing processing is performed, for example, by keeping the substrate 11 for 40 hours at the temperature of 600 °C. in an atmosphere of nitrogen (N$_2$) in an electric furnace.

A growing condition of the single crystal regions 19 and 20 produced by the low temperature solid phase annealing processing is described subsequently with reference to FIGS. 2(1) and 2(2).

Referring first to FIG. 2(1), there is shown a growing condition of crystals after excimer laser light is irradiated at a region of the diameter of 0.7 $\mu$m as shown in FIG. 1(3) and then the low temperature solid phase annealing processing is performed for three hours. As seen in FIG. 2(1), a core now shown from which a crystal is to be grown is produced in a region in which an excimer laser beam has been irradiated (portion surrounded by an alternate long and two short dashes line). Dendrite 21 grows substantially radially from the core to form a single crystal region 19 or 20.

A condition after the low temperature vapor phase annealing processing is further continued is shown in FIG. 2(2). In this instance, the dendrite 21 further grows so that the single crystal region 19 in which the crystal has grown from a core finally makes contacts with an adjacent single crystal region 20. In this instance, a grain boundary 22 is formed at a location at which the single crystal regions 19 and 20 make contact with each other.

The single crystal regions 19 and 20 formed in such a manner as described above are superior in uniformity in film quality and have a high carrier mobility with low leakage. Further, since the single crystal regions 19 and 20 can be formed at desired positions of the amorphous semiconductor layer 13, when a transistor is to be formed on the amorphous semiconductor layer 13, it is possible to form a channel layer of the transistor in the single crystal region 19 or 20.

When the single crystal regions 19 and 20 are employed for channel layers of transistors, the carrier mobility $\mu$ is high. Incidentally, in the case of a thin film transistor, the value of the carrier mobility $\mu$ is higher than 100 cm$^2$/Vs or so. Consequently, the transconductance gm is high, and consequently, the leakage current is small.

Further, since no grain boundary exists in a channel layer, the dispersions of the leakage current and the threshold voltage Vth are small.

Further, since the temperature of heat processing for crystallization is equal to or lower than 600° C., low temperature processing is allowed.

Referring now to FIGS. 4(A) to 5(B), there are shown different steps of another method of epitaxially growing semiconductor crystals according to a second preferred embodiment of the present invention. In the present embodiment, a single crystal grain thin film transistor is formed on a silicon substrate using a focused ion beam.

Figure 4A:
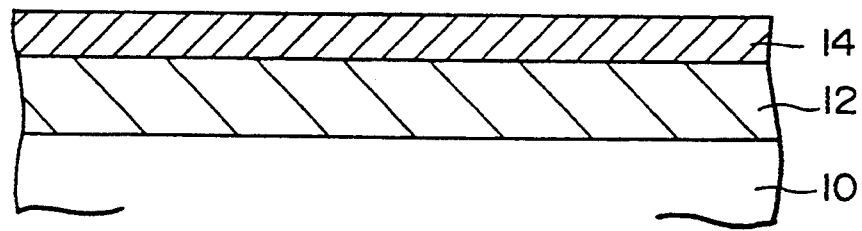
FIGS. 4(A) to 4(C) are schematic sectional views showing different steps of a method of epitaxially growing semiconductor crystal of another preferred embodiment of the present invention.

First, an insulating film 12 is formed on a silicon substrate 10 by a thermal oxidation method or a chemical vapor deposition (CVD) method, and then, an amorphous silicon thin film 14 of the thickness of 40 nm or so is on the insulating film 12 by an ordinary chemical vapor deposition method as shown in FIG. 4(A). It is to be noted that it is otherwise possible to deposit a polycrystalline silicon thin film on the insulating film 12 and then effect ion implantation of Si at a dose of 10$^{14}$ cm$^{-2}$ to 10$^{15}$ cm$^{-2}$ to form an amorphous silicon thin film 14.

Figure 4B:
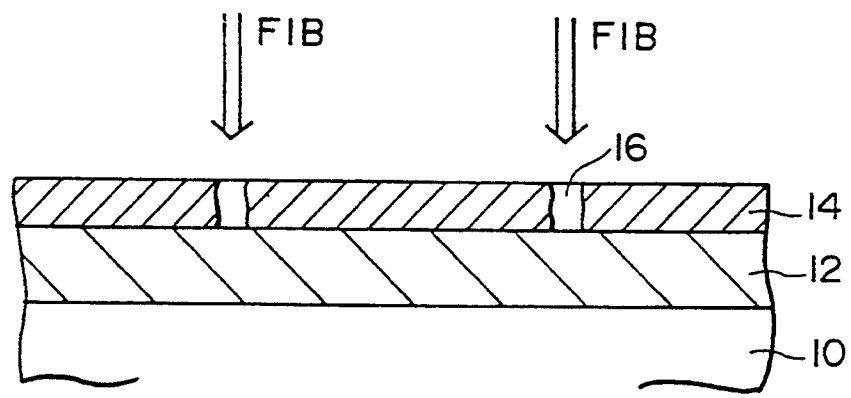

Subsequently, an energy beam is irradiated on a region of the silicon thin film 14 which is positioned substantially at the center of a region which is to form an active region of a thin film transistor. A focused ion beam which is formed from He$^+$ions and has a beam diameter converged to 0.2 $\mu$m or less is used as the energy beam. Preferably, the surface density of energy irradiated upon the amorphous silicon thin film 14 is 150 mJ/cm$^2$ or so. As a result of the irradiation of the energy beam, a silicon core 16 is formed in the predetermined region of the amorphous silicon thin film 14 as seen in FIG. 4(B). The operation is performed for each of regions of the silicon thin film 14 which are to become active regions of the thin film transistors.

Figure 4C:
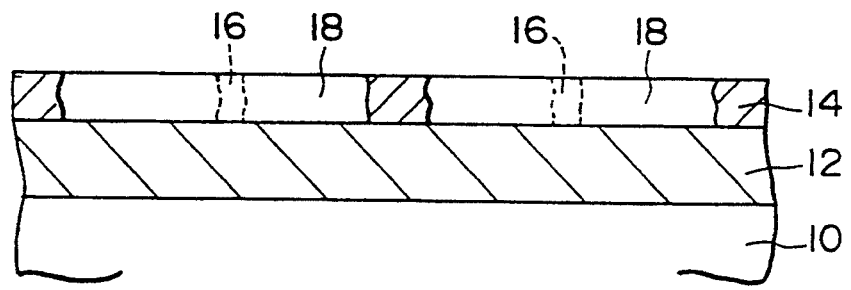

After the irradiation of the energy beam has been performed for all of the regions of the silicon thin film 14 which are to become active regions of the thin film transistors, solid phase growth is performed at a low temperature of 600° C. or so to grow crystals 18 until a desired grain diameter is reached as seen in FIG. 4(C). Preferably, heat processing for a short period of time at a high temperature by means of an excimer laser beam or the like is thereafter performed in order to improve the characteristic of the thin film transistors.

Figure 5A:
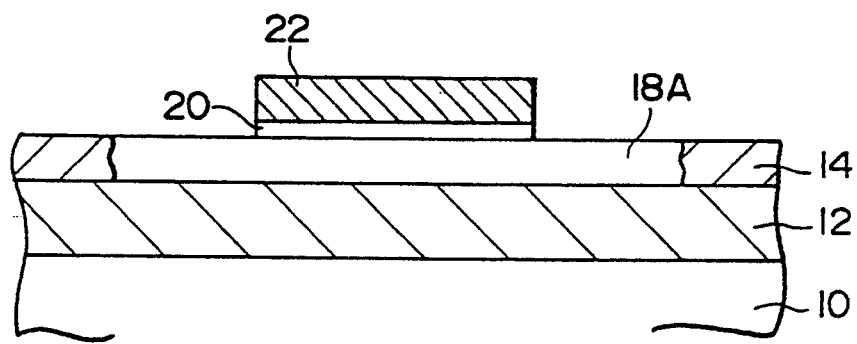
FIGS. 5(A) and 5(B) are schematic sectional views showing different steps of the method subsequent to the step shown in FIG. 4(C).
Figure 5B:
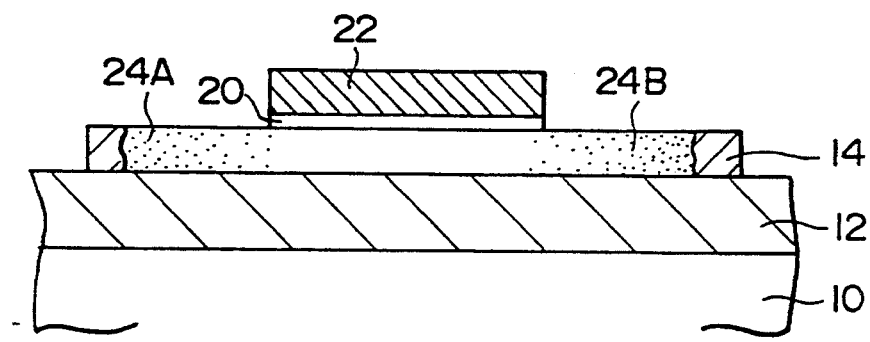

Subsequently, a gate oxide film 20 and a gate electrode 22 are formed in a thus obtained single crystal region 18A by a conventional chemical vapor deposition method or lithography technique as seen in FIG. 5(A). Finally, ion implantation of $B^+$ or so is performed, and then the ions thus implanted are activated by annealing processing such as electric furnace annealing, rapid thermal annealing or excimer laser annealing to form a source region 24A and a drain region 24B as seen in FIG. 5(B).

While a method of epitaxially growing semiconductor crystal of the present invention is described above with reference to the preferred embodiments thereof, the present invention is not limited to the specific embodiments described above. The conditions of the numerical values and so forth indicated at the various steps can be changed suitably. The silicon substrate 10 can be replaced, for example, by a glass substrate. Further, for example, a silicon nitride film may be used in place of $SiO_2$ as the insulating film 12. The focused ion beam can be replaced by an electron beam the diameter of which can be further converged small.

Having now fully described the invention, it will be apparent to one of ordinary skill in the art that many changes and modifications can be made thereto without departing from the spirit and scope of the invention as set forth herein.

What is claimed is:

1. A method of epitaxially growing semiconductor crystal, comprising the steps of:
    forming an amorphous semiconductor layer on a substrate;
    forming a shield mask, in which a through-hole is formed, on an upper face of the amorphous semiconductor layer on the substrate;
    irradiating excimer laser light upon the amorphous semiconductor layer using the shield mask to produce, at a portion in the amorphous semiconductor layer corresponding to the through-hole, a core from which crystal is to be grown;
    removing the shield mask; and
    growing, by low temperature solid phase annealing processing for the amorphous semiconductor layer, crystal from the core to form a single crystal region in the amorphous semiconductor layer.

2. A method of epitaxially growing semiconductor crystal according to claim 1, wherein the shield mask forming step includes the steps of forming a silicon oxide film on the upper face of the amorphous semiconductor layer, forming a silicon film on an upper face of the silicon oxide film, and forming a through-hole in the silicon oxide film and the silicon film which serve as the shield mask.

3. A method of epitaxially growing semiconductor crystal according to claim 2, wherein the thickness of the silicon film is equal to or greater than 80 nm.

* * * * *